(12) United States Patent
Uemura et al.

(10) Patent No.: US 10,186,838 B2
(45) Date of Patent: Jan. 22, 2019

(54) SEMICONDUCTOR LIGHT-EMITTING ELEMENT

(71) Applicants: KABUSHIKI KAISHA TOSHIBA, Minato-ku (JP); Photonics Electronics Technology Research Association, Bunkyo-ku (JP)

(72) Inventors: Hirotaka Uemura, Kawasaki (JP); Haruhiko Yoshida, Funabashi (JP); Kazuya Ohira, Tokyo (JP); Mizunori Ezaki, Yokohama (JP); Norio Iizuka, Kawasaki (JP)

(73) Assignees: KABUSHIKI KAISHA TOSHIBA, Minato-ku (JP); Photonics Electronics Technology Research Association, Bunkyo-ku (JP)

( * ) Notice: Subject to any disclaimer, the term of this patent is extended or adjusted under 35 U.S.C. 154(b) by 0 days.

(21) Appl. No.: 15/444,636

(22) Filed: Feb. 28, 2017

(65) Prior Publication Data

US 2017/0170630 A1 Jun. 15, 2017

Related U.S. Application Data

(63) Continuation of application No. PCT/JP2015/075568, filed on Sep. 9, 2015.

(30) Foreign Application Priority Data

Sep. 19, 2014 (JP) ................................. 2014-190678

(51) Int. Cl.
*H01S 5/10* (2006.01)
*H01S 5/323* (2006.01)
(Continued)

(52) U.S. Cl.
CPC ........ *H01S 5/1071* (2013.01); *G02B 6/12007* (2013.01); *G02B 6/29338* (2013.01);
(Continued)

(58) Field of Classification Search
CPC ...... H01S 5/1071; H01S 5/026; H01S 5/0651; H01S 5/00; H01S 5/1003; H01S 5/101;
(Continued)

(56) References Cited

U.S. PATENT DOCUMENTS

| 5,349,601 A | 9/1994 | Hohimer et al. |
| 6,351,311 B1 * | 2/2002 | Numai ................... G01C 19/66 356/461 |

(Continued)

FOREIGN PATENT DOCUMENTS

| JP | 2002-22461 A | 1/2002 |
| JP | 2009-278015 A | 11/2009 |

(Continued)

OTHER PUBLICATIONS

International Search Report dated Dec. 1, 2015, in PCT/JP2015/075568, filed Sep. 9, 2015 (with English-language translation).

(Continued)

*Primary Examiner* — Xinning (Tom) Niu
*Assistant Examiner* — Delma R Forde
(74) *Attorney, Agent, or Firm* — Oblon, McClelland, Maier & Neustadt, L.L.P.

(57) ABSTRACT

According to one embodiment, a semiconductor light-emitting element includes a ring-shaped light-emitting portion provided on a substrate, a mode-control light waveguide of Si provided on an upper or a lower surface side of the light-emitting portion, and including at least two portions located close to the light-emitting portion, and an output light waveguide of Si provided on the upper or the lower surface side, and including a portion located close to the (Continued)

light-emitting portion. The mode-control light waveguide has a structure for coupling light traveling in one of a clockwise circulating mode and a counterclockwise circulating mode, and feeding back the light in the other of the clockwise circulating mode and the counterclockwise circulating mode.

15 Claims, 9 Drawing Sheets

(51) Int. Cl.
*G02B 6/293* (2006.01)
*H01S 5/026* (2006.01)
*H01S 5/065* (2006.01)
*G02B 6/12* (2006.01)
*H01S 3/08* (2006.01)
*H01S 5/02* (2006.01)
*H01S 5/14* (2006.01)

(52) U.S. Cl.
CPC ............ *H01S 5/026* (2013.01); *H01S 5/0651* (2013.01); *H01S 5/1032* (2013.01); *H01S 5/323* (2013.01); *H01S 3/08031* (2013.01); *H01S 5/021* (2013.01); *H01S 5/142* (2013.01); *H01S 2301/02* (2013.01)

(58) Field of Classification Search
CPC .................. H01S 5/021; H01S 5/1014; H01S 5/2022–5/2031; H01S 5/323; H01S 3/0637; H01S 3/083; H01S 2301/16; H01S 5/0653–5/0655; G02B 6/29338
See application file for complete search history.

(56) References Cited

U.S. PATENT DOCUMENTS

| | | | |
|---|---|---|---|
| 6,680,962 B2* | 1/2004 | Liu | H01S 5/10 372/43.01 |
| 6,728,279 B1* | 4/2004 | Sarlet | H01S 5/06256 372/43.01 |
| 8,494,023 B2* | 7/2013 | Yamazaki | G02B 6/125 372/66 |
| 9,653,882 B1* | 5/2017 | Zheng | H01S 5/0687 |
| 9,748,726 B1* | 8/2017 | Morton | H01S 3/083 |
| 2002/0021732 A1 | 2/2002 | Numai | |
| 2005/0025199 A1* | 2/2005 | Ma | H01S 5/141 372/20 |
| 2009/0285251 A1 | 11/2009 | Yamazaki | |
| 2010/0008390 A1 | 1/2010 | Osinski et al. | |
| 2010/0034223 A1 | 2/2010 | Osinski et al. | |
| 2011/0129231 A1* | 6/2011 | Fiorentino | G02B 6/4204 398/141 |
| 2011/0163421 A1* | 7/2011 | Mi | B82Y 10/00 257/618 |
| 2012/0002694 A1 | 1/2012 | Bowers et al. | |
| 2012/0069862 A1 | 3/2012 | Ohira et al. | |
| 2014/0126601 A1* | 5/2014 | Jeong | H01S 5/1032 372/50.11 |
| 2014/0133512 A1 | 5/2014 | Akiyama | |
| 2014/0161148 A1* | 6/2014 | Osinki | H01S 5/4006 372/50.1 |
| 2014/0185641 A1 | 7/2014 | Yoshida et al. | |
| 2015/0222089 A1* | 8/2015 | Jeong | H01S 5/142 359/346 |
| 2015/0277041 A1* | 10/2015 | Nakagawa | G02B 6/122 385/14 |
| 2016/0049767 A1* | 2/2016 | Morton | H01S 3/083 372/20 |
| 2018/0131155 A1* | 5/2018 | Purnawirman | H01S 3/1608 |

FOREIGN PATENT DOCUMENTS

| | | |
|---|---|---|
| JP | 2012-64812 A | 3/2012 |
| JP | 2013-534059 A | 8/2013 |
| JP | 2014-130939 A | 7/2014 |
| WO | WO 2013/035182 A1 | 3/2013 |

OTHER PUBLICATIONS

Written Opinion dated Dec. 1, 2015, in PCT/JP2015/075568, filed Sep. 9, 2015.
J. P. Hohimer, et al., "Improving the performance of semiconductor ring lasers by controlled reflection feedback", Applied Physics Letters, vol. 61, No. 9, Aug. 31, 1992, pp. 1013-1015.
J. P. Hohimer, et al., "Unidirectional operation in a semiconductor ring diode laser", Applied Physics Letters, vol. 62, No. 11, Mar. 15, 1993, pp. 1185-1187.
Di Liang, et al., "Teardrop Reflector-Assisted Unidirectional Hybrid Silicon Microring Lasers", IEEE Photonics Technology Letters, vol. 24, No. 22, Nov. 15, 2012, pp. 1988-1990.
P. Mechet, et al., "Unidirectional III-V microdisk lasers heterogeneously integrated on SOI", Optics Express, vol. 21, No. 16, Aug. 8, 2013, pp. 19339-19352.
M. Sorel, et al., "Unidirectional bistability in semiconductor waveguide ring lasers", Applied Physics Letters, vol. 80, No. 17, Apr. 29, 2002, pp. 3051-3053.
Ioanna Stamataki, et al., "Investigation on the Multimode Dynamics of InGaAsP—InP Microring Lasers", IEEE Journal of Quantum Electronics, vol. 42, No. 12, Dec. 2006, pp. 1266-1273.
Hongjun Cao, et al., "Large S-Section-Ring-Cavity Diode Lasers: Directional Switching, Electrical Diagnostics, and Mode Beating Spectra", IEEE Photonics Technology Letters, vol. 17, No. 2, Feb. 2005, pp. 282-284.
James J. Liang, et al., "Unidirectional operation of waveguide diode ring lasers", Applied Physics Letters, vol. 70, No. 10, Mar. 10, 1997, pp. 1192-1194.

* cited by examiner

SEMICONDUCTOR LIGHT-EMITTING ELEMENT

CROSS REFERENCE TO RELATED APPLICATIONS

This application is a Continuation Application of PCT Application No. PCT/JP2015/075568, filed Sep. 9, 2015 and based upon and claiming the benefit of priority from Japanese Patent Application No. 2014-190678, filed Sep. 19, 2014, the entire contents of all of which are incorporated herein by reference.

FIELD

Embodiments described herein relate generally to a semiconductor light-emitting element including a ring-shaped light-emitting portion.

BACKGROUND

In recent years, in order to achieve optical transmission at a low loss and a high density, various on-chip optical interconnects have been proposed in which data input and output are performed at a high speed and with a low power consumption. In order to achieve such an optical interconnect, attention is paid to a microring laser diode (LD) using a microring resonator, which is applied as a small light source. In this type of microring LD, the key to put it into practice is stabilization of circulating modes.

In order that stabilization of the circulating modes be improved, it has been proposed that in a microring LD, a light-emitting portion formed of a group III-V compound semiconductor and a feedback waveguide formed of a group III-V compound semiconductor are provided. However, in this structure, an absorption loss in the waveguide is great. Furthermore, the radius of curvature of the feedback waveguide cannot be greatly reduced. Thus, it is hard to make a microring resonator smaller.

DETAILED DESCRIPTION

In general, according to one embodiment, a semiconductor light-emitting element comprises: a ring-shaped light-emitting portion provided on part of a substrate; a mode-control light waveguide formed of Si and provided on an upper surface side or a lower surface side of the light-emitting portion, and including at least two portions located close to the light-emitting portion; and an output light waveguide formed of Si and provided on the upper surface side or the lower surface side of the light-emitting portion, and including a portion located close to the light-emitting portion, wherein the mode-control light waveguide has a structure for coupling light traveling in one of a clockwise circulating mode and a counterclockwise circulating mode of the light-emitting portion, and feeding back the light in the other of the clockwise circulating mode and the counterclockwise circulating mode.

Embodiments will be hereinafter described with reference to the accompanying drawings.

First Embodiment

Figure 1:
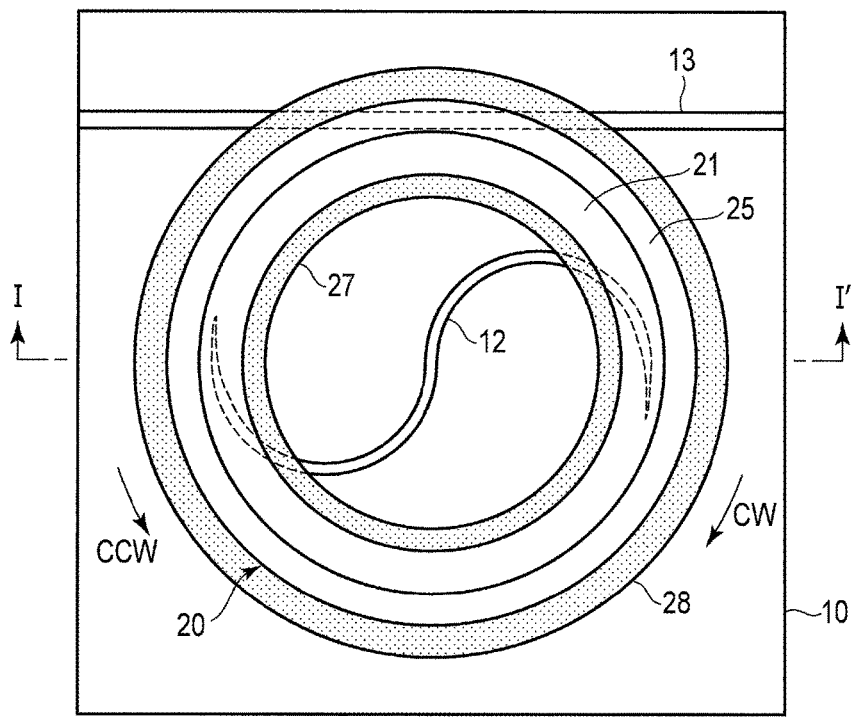
FIG. 1 is a plan view illustrating a schematic configuration of a semiconductor light-emitting element according to a first embodiment.
Figure 2:
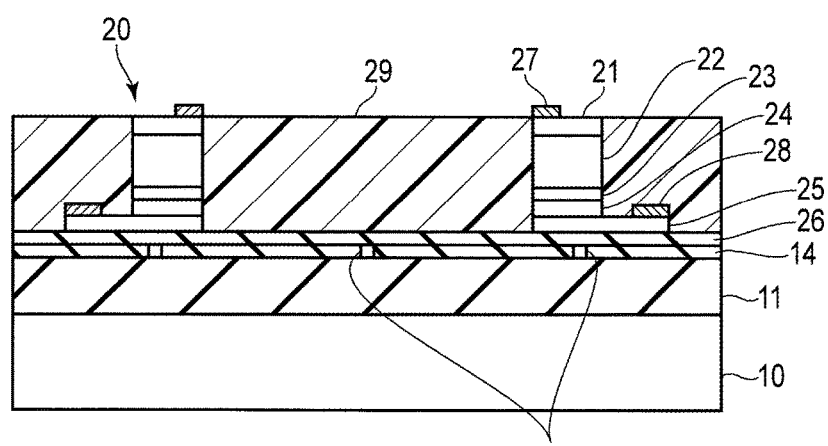
FIG. 2 is a cross-sectional view illustrating the schematic configuration of the semiconductor light-emitting element according to the first embodiment.

FIGS. 1 and 2 are views for explaining a schematic configuration of a semiconductor light-emitting device according to a first embodiment. FIG. 1 is a plan view illustrating a relationship between a light-emitting portion and a waveguide, and FIG. 2 is a cross-sectional view which is taken along line I-I' as seen in the direction of arrows in FIG. 1. It should be noted that FIG. 1 illustrates only a characteristic portion in order that the following explanation be understandable.

An insulating film 11 formed of a $SiO_2$ or the like is provided on a Si substrate 10. On the insulating film 11, an S-shaped Si feedback waveguide (mode-control optical waveguide) 12 and a Si output waveguide (output optical waveguide) 13 are formed. To be more specific, a Si layer formed of SOI is processed to be S-shaped, to thereby form the Si feedback waveguide 12. Also, a Si layer formed of SOI is processed to be linear, to thereby form a Si output waveguide 13 for use in outputting light from a ring laser diode (LD [light emitting unit]) to be described later, to the outside. Each of the waveguides 12 and 13 has a width of, for example, 600 nm and a height of, for example, 400 nm. In areas laterally adjacent to the waveguides 12 and 13, oxide films 14 formed of $SiO_2$ are embedded, as a result of which their surfaces are flat.

It should be noted that a Si substrate 10 is provided to extend to a region not illustrated. In a region of the Si substrate 10 which is other than a region in which the semiconductor light-emitting element is provided, the semiconductor photodetector and other active elements are formed. Also, for example, the Si output waveguide 13 is optically coupled to a semiconductor light receiving element.

To a region of the substrate in which the waveguides 12 and 13 are formed, a ring-shaped semiconductor multilayered structure 20 is jointed, which forms a light-emitting unit of a microring LD. In the semiconductor multilayered structure (light-emitting unit) 20, a double-heterostructure portion in which an InGaAs active layer 23 is held between a p-type GaAlAs clad layer 22 and an n-type GaAlAs clad layer 24 is provided, and the double-heterostructure portion is held between a p-type GaAs contact layer 21 and an n-type GaAs contact layer 25. Also, the semiconductor multilayered structure 20 is joined to the region of the substrate in which the waveguides 12 and 13 are formed, with the contact layer 25 located on a lower side.

It should be noted that the active layer 23 need not always to be a single layer; i.e., it may have a structure in which an InGaAs/GaAs multiple quantum well layer is held between GaAlAs clad layers. Furthermore, in the semiconductor multilayered structure 20, the type of the p-type layers may be changed to n-type, and the type of the n-type layers may be changed to p-type.

The n-type GaAs contact layer 25 located on the lower side is provided to outwardly project from the ring of the semiconductor multilayered structure 20. On a projected portion of the contact layer 25, an n-side electrode 28 is provided, and formed in the shape of a ring. Also, on the p-type GaAs contact layer 21, a p-side electrode 27 is provided, and formed in the shape of a ring.

Furthermore, space located inward and outward of the semiconductor multilayered structure 20 is filled with insulating films 29 formed of polyimide. Furthermore, a junction portion of the semiconductor multilayered structure 20, which is an underlying substrate, is an oxide film 26 formed of $SiO_2$ or the like. The oxide film 26 is joined to the underlying structure.

It should be noted that in the case where the semiconductor multilayered structure 20 is joined to the underlying structure, a p-type GaAs contact layer 21 having a thickness of 200 nm, a p-type GaAlAs clad layer 22 having a thickness of 1.6 µm, an InGaAs active layer 23 having a thickness of 5 nm, an n-type GaAlAs clad layer 24 having a thickness of 250 nm, and an n-type GaAs contact layer 25 having a thickness of 200 nm are formed on a GaAs substrate (not shown), and then the n-type GaAs contact layer is jointed to the underlying substrate. In this case, it is preferable that a nitride film formed of SiN or the like or an oxide film 26 formed of $SiO_2$ or the like be formed on the n-type GaAs contact layer 25. Furthermore, in the underlying structure, an oxide film 14 formed of $SiO_2$ or the like be embedded in areas laterally adjacent to the waveguides 12 and 13, and its surface be flattened. After the above joining process, the GaAs substrate is removed, and the semiconductor multilayered structure 20 is processed to be shaped in the form of a ring. This processing is executed such that an outer periphery of the n-type GaAs contact layer 25 more outwardly project than those of the other layers, i.e., the above layers 21 to 24.

The Si feedback waveguide 12 is S-shaped, and located inward of the semiconductor multilayered structure 20, such that the S-shaped waveguide 12 and the semiconductor multilayered structure 20 overlap with each other at both ends of the waveguide 12. Also, both end portions of the Si feedback waveguide 12 are tapered. Furthermore, the radius of curvature of the both end portions of the Si feedback waveguide 12 is greater than that of the semiconductor multilayered structure 20, which is formed in the shape of a ring. The Si output waveguide 13 is provided such that the Si output waveguide 13 and the semiconductor multilayered structure 20 overlap with each other.

The microring LD has a clockwise (CW) circulating mode and a counterclockwise (CCW) circulating mode. However, in the first embodiment, these circulating modes are forcibly limited to one by the S-shaped Si feedback waveguide 12. To be more specific, in the microring LD, CCW circulating light enters the Si feedback waveguide 12, and is fed back to a light-emitting portion 20 as CW circulating light. By contrast, most of CW circulating light does not enter the Si feedback waveguide 12. Thus, the CW circulating mode is given higher priority than the CCW circulating mode.

Figure 3A:
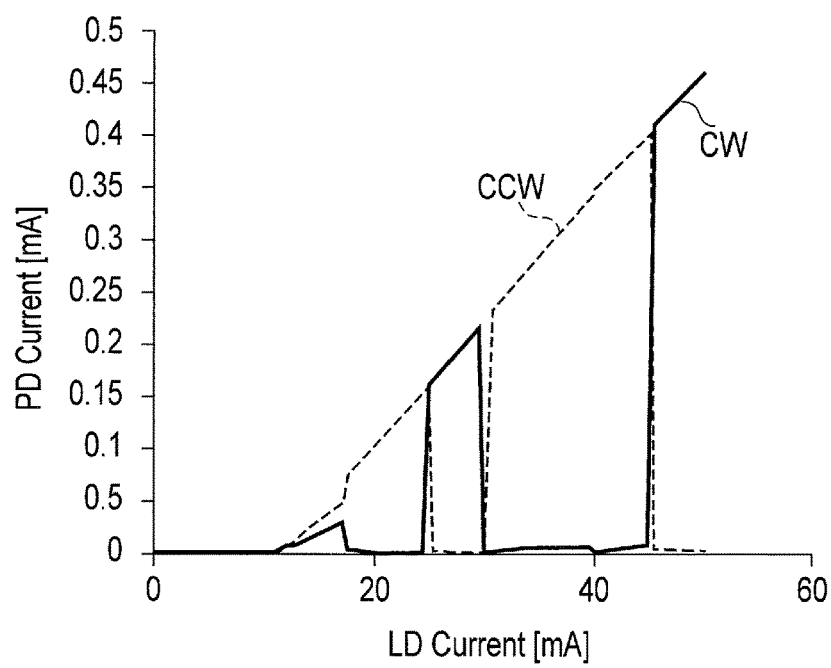
FIG. 3A is a characteristic view showing a relationship between a drive current of a LD and a detection current of a PD (in the case where a Si feedback waveguide is not provided).
Figure 3B:
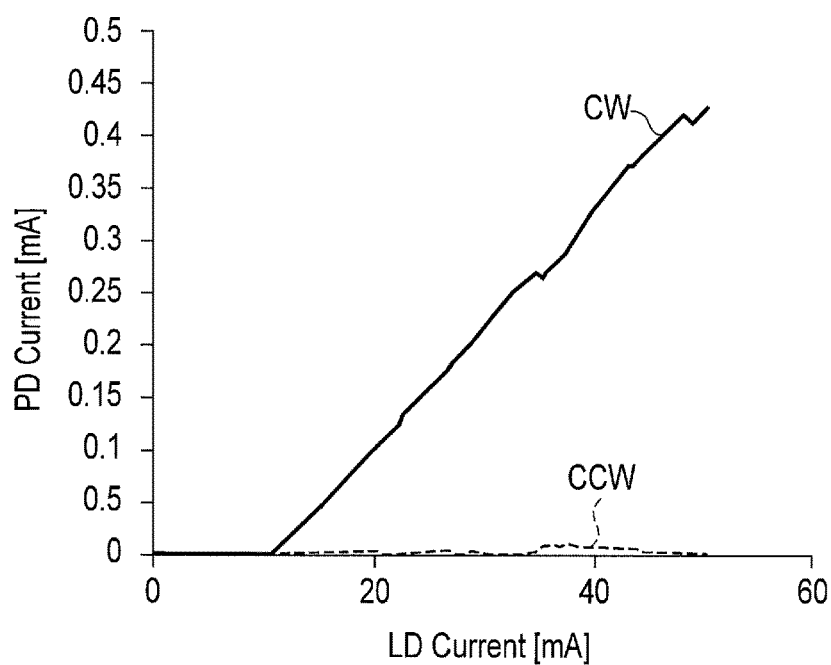
FIG. 3B is a characteristic view showing a relationship between the drive current of the LD and the detection current of the PD (in the case where a Si feedback waveguide is provided).

FIGS. 3A and 3B illustrate a difference between CW and CCW circulating-mode characteristics obtained in the cases where the Si feedback waveguide 12 is present and where it is absent. To be more specific, in the case where the Si feedback waveguide 12 is absent, as illustrated in FIG. 3A, the CW circulating mode and the CCW circulating mode are both established, and oscillation becomes unstable. By contrast, in the first embodiment, the Si feedback waveguide 12 is provided, as illustrated in FIG. 3B, the CW circulating mode becomes dominant, and the CCW circulating mode almost disappears. Thus, oscillation in the microring LD is stabilized.

Furthermore, since the feedback waveguide 12 is formed of Si, the absorption loss in the waveguide 12 can be reduced, as compared with the case where the feedback waveguide 12 is formed of a group III-V compound semiconductor. The above can be achieved by joining the semiconductor multilayered structure 20 formed on the GaAs substrate to an SOI substrate using a technique for bonding substrates to each other.

In addition, in the first embodiment, since a distal end portion of the Si feedback waveguide 12 is tapered, it is possible to reduce reflection at the distal end of the waveguide. Also, since the radius of curvature of the distal end is set great, the following advantage can also be obtained.

Figure 4:
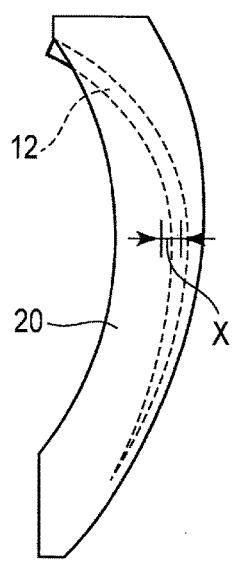
FIG. 4 is an enlarged plan view illustrating a distal end portion of the Si feedback waveguide.

FIG. 4 is an enlarged view illustrating the distal end portion of the Si feedback waveguide 12 along with part of the semiconductor multilayered structure 20. It is assumed that in the case where the radius of curvature of the distal end portion of the Si feedback waveguide 12 is equal to that of the semiconductor multilayered structure 20, a circumferential center position of the ring-shaped semiconductor multilayered structure 20 which is intermediate between an inner circumferential portion and an outer circumferential portion of the semiconductor multilayered structure 20 is coincident with a center position of the distal end portion, and they are parallel to each other. Also, it is assumed that displacement of the center position of the distal end portion from the circumferential center position of the semiconductor multilayered structure 20, which occurs in the case where the radius of curvature of the distal end portion is different from that of the semiconductor multilayered structure 20, is x.

Figure 5A:
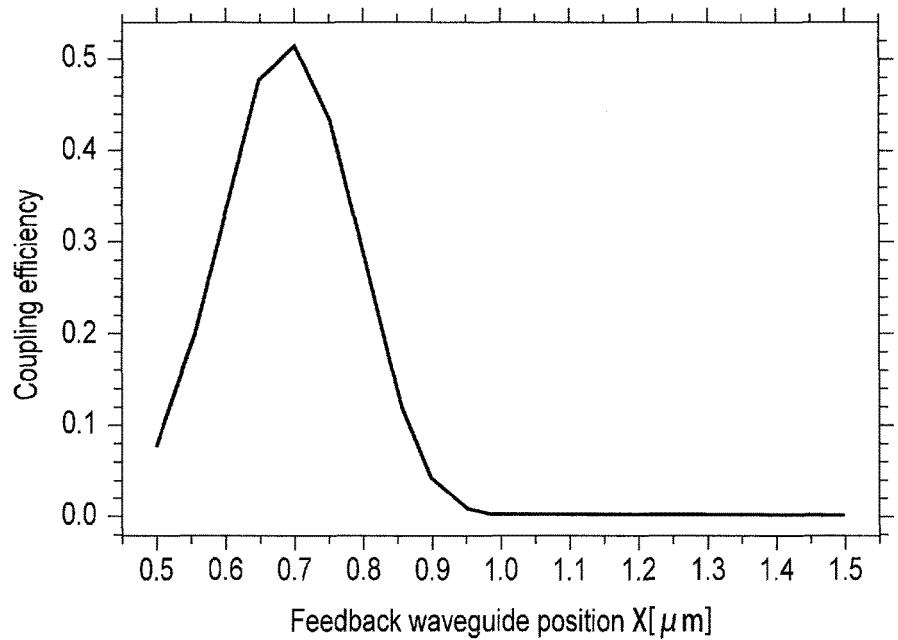
FIG. 5A is a characteristic view showing a change of a coupling efficiency which is made in accordance with the set position of the Si feedback waveguide (in the case where the tapered distal end has the same radius of curvature as a ring-shaped resonator).
Figure 5B:
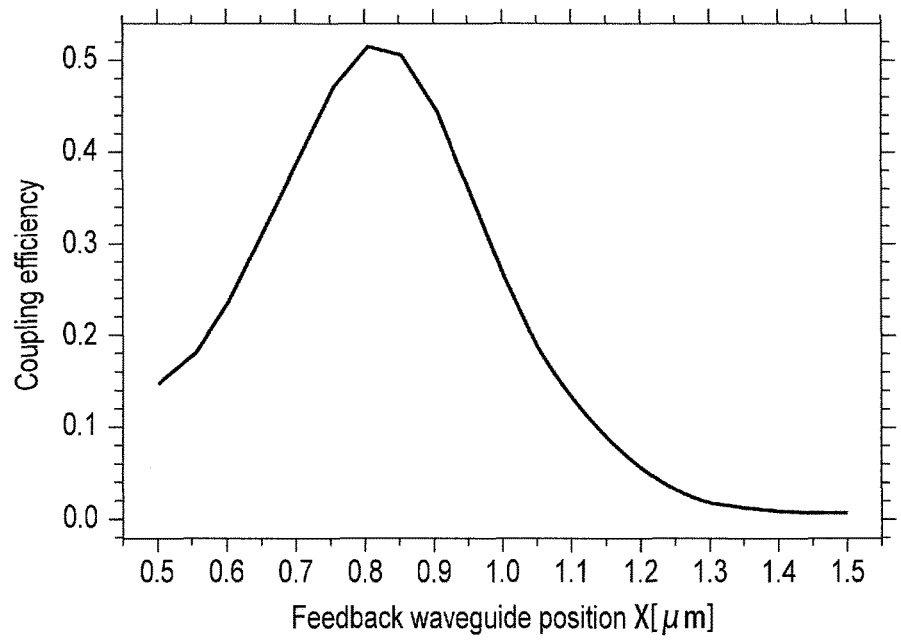
FIG. 5B is a characteristic view showing a change of the coupling efficiency which is made in accordance with the set position of the Si feedback waveguide (in the case where the tapered distal end has a radius of curvature different from that of the ring-shaped resonator).

FIGS. 5A and 5B are views showing a feedback waveguide position (X) dependence of an optical coupling efficiency from the semiconductor multilayered structure to the Si feedback waveguide, which is calculated by a beam-propagation method.

In the following, it is assumed that a Si feedback waveguide position (X) is a distance between the center of the Si feedback waveguide 12 and the circumferential center of a ring resonator, in a location at which the Si feedback waveguide 12 and the ring resonator (the semiconductor multilayered structure 20) are parallel to each other.

When X=0, the circumferential center of the ring resonator is coincident with the center of the Si feedback waveguide 12, and when X>0, the center of the Si feedback waveguide 12 is shifted to the outside of the ring resonator.

It is assumed that the ring resonator has a ring diameter of 50 μm and a mesa width of 2 μm, and the Si feedback waveguide 12 is a rib type waveguide having a width of 600 nm, a slab thickness of 200 nm and a mesa height of 200 nm.

FIG. 5A shows an optical coupling efficiency in the case where the tapered distal end has the same radius of curvature (R=25 μm) as the ring resonator, i.e., in the case where the tapered distal end of the Si feedback waveguide 12 is provided parallel to the circumferential center of the ring resonator. FIG. 5B shows an optical coupling efficiency in the case where the radius of curvature of the tapered distal end is set to a value (R to 27.5 μm) which is greater than that of the ring resonator by approximately ten percent, and the tapered distal end of the Si feedback waveguide 12 obliquely crosses the circumferential center of the ring resonator.

If X is displaced by 100 nm from a feedback waveguide position (X) at which the coupling efficiency is the maximum, in the case shown in FIG. 5A, the coupling efficiency lowers by approximately 50%, and in the case shown in FIG. 5B, the coupling efficiency lowers by approximately 13%; that is, lowering of the coupling efficiency is reduced. In such a manner, the shape of part of the Si feedback waveguide 12 in which optical coupling is carried out is adjusted, thereby reducing displacement from design, which occurs in an element processing process. For example, even if displacement of 50 to 100 nm occurs in alignment using a stepper, it is possible to reduce a change of an element characteristic. That is, it is possible to ensure a sufficient process margin.

In such a manner, according to the first embodiment, a microring LD is formed using a semiconductor multilayered structure 20 comprising stacked layers formed in the shape of a ring, and in the microring LD, an S-shaped Si feedback waveguide 12 is formed such that optical coupling can be achieved, to thereby provide a semiconductor light-emitting element in which circulating modes are stable. In this case, as the feedback waveguide 12, a Si waveguide is used which has a higher refractive index than that of a III-V compound semiconductor, and is thinner than the III-V compound semiconductor. Thereby, light loss in the feedback waveguide 12 can be reduced, and the radius of S-shaped part can be reduced. This results in reduction of the diameter of the ring of the light-emitting portion. It is therefore advantageous in reduction of the size of a device structure.

Furthermore, since the distal end portion of the Si feedback waveguide 12 is tapered, it is possible to reduce reflection at the distal end of the waveguide, and also reduce returning light. Also, since the radius of curvature of the distal end is set great, the process margin can be improved.

Furthermore, since the Si waveguide 12 is formed in a substrate other than a substrate where the light-emitting portion is formed in a region of the substrate which is other than a region in which where the light-emitting portion is formed), the waveguide 12 can be designed in width and location with a high degree of flexibility. Therefore, a proper feedback intensity can be easily achieved by appropriately designing the width and location of the waveguide 12.

Second Embodiment

Figure 6:
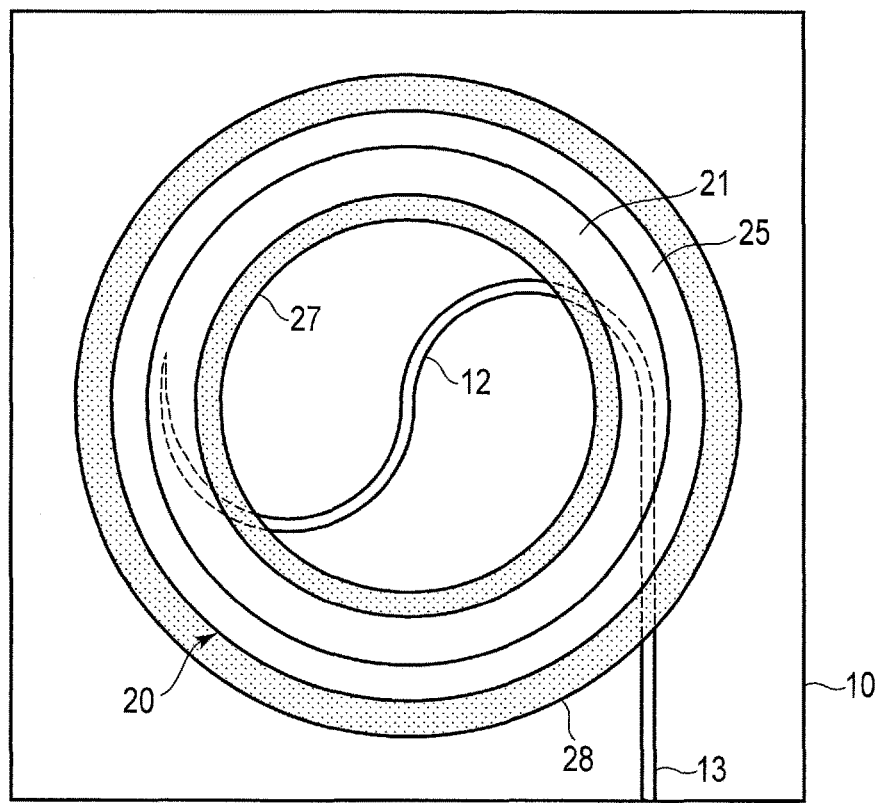
FIG. 6 is a plan view illustrating a schematic configuration of a semiconductor light-emitting element according to a second embodiment.

FIG. 6 is a plan view for explaining a schematic configuration of a semiconductor light-emitting element according to a second embodiment, and also shows a relationship between a light-emitting portion and a waveguide. It should be noted that elements identical to the elements explained above will be respectively denoted by the same reference numbers as the explained elements, and their detailed explanations will be omitted.

In the second embodiment, a Si feedback waveguide 12 and a Si output waveguide 13 are formed as a single body. In this regard, the second embodiment is different from the first embodiment. To be more specific, at one of ends of the Si feedback waveguide 12, a ring-shaped light-emitting portion (semiconductor multilayered structure) 20 and the Si feedback waveguide 12 overlap with each other as in the first embodiment, and its distal end is tapered. Also, at the other end of the Si feedback waveguide 12, the light-emitting portion and the Si feedback waveguide 12 overlap with each other; however, the other end of the Si feedback waveguide is continuous with the Si output waveguide 13, which is linearly formed. It should be noted that elements other than the waveguide have the same structures as those as illustrated in FIG. 2.

By virtue of such a structure, in the second embodiment, the effect similar to the first embodiment is obtained. Further, in the waveguides 12 and 13 and the light-emitting portion 20, the number of portions where optical coupling is carried out can be reduced. This results in reduction of a coupling loss in optical-coupling portions.

Third Embodiment

Figure 7:
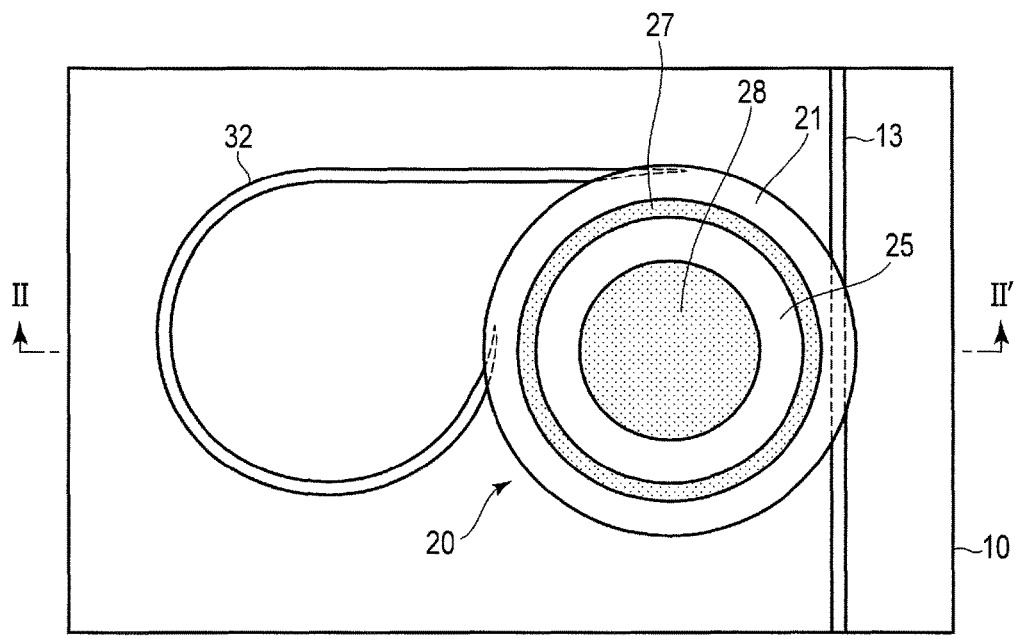
FIG. 7 is a plan view illustrating a schematic configuration of a semiconductor light-emitting element according to a third embodiment.
Figure 8:
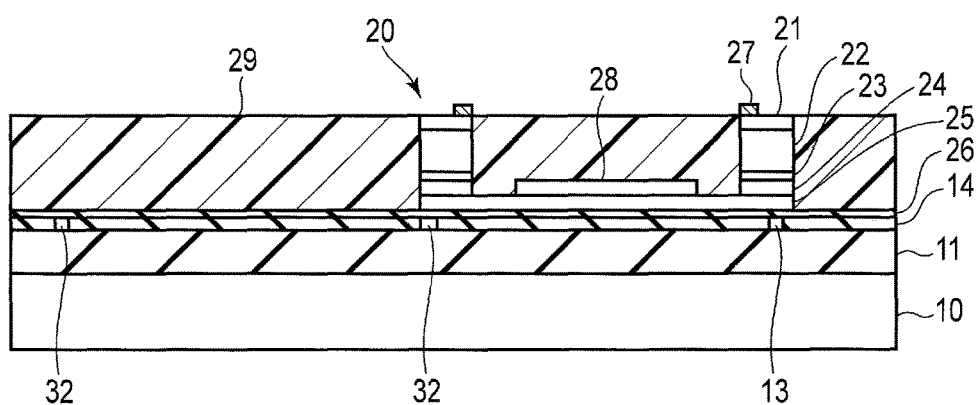
FIG. 8 is a cross-sectional view illustrating the schematic configuration of the semiconductor light-emitting element according to the third embodiment.

FIGS. 7 and 8 are views for explaining a schematic configuration of a semiconductor light-emitting element according to a third embodiment. FIG. 7 is a plan view showing a relationship between a light-emitting portion and a waveguide, and FIG. 8 is a cross-sectional view which is taken along line II-II' as seen in the direction of arrows in FIG. 7. It should be noted that elements identical to those in FIGS. 1 and 2 will be respectively denoted by the same reference numbers as those in FIGS. 1 and 2, and their detailed explanations will be omitted.

In the third embodiment, a Si feedback waveguide 12 is provided not only inward of a ring-shaped light-emitting portion 20 but outward of the light-emitting portion 20. In this regard, the third embodiment is different from the first embodiment. To be more specific, a C-shaped Si feedback waveguide 32 is provided outward of the ring-shaped light-emitting portion 20, such that the light-emitting portion 20 and the Si feedback waveguide 32 overlap with each other at both ends of the waveguide 32. Also, the both ends of the Si feedback waveguide 32 are provided to extend along the CW direction of a ring LD, and their distal ends are tapered.

Furthermore, unlike layers 21 to 24 in the light-emitting portion 20, an n-type GaAs contact layer 25 is continuously formed such that its inner side is not removed. In addition, on an inner portion of the contact layer 25, an n-side electrode 28 is provided.

Even in such a structure, because of provision of the C-shaped Si feedback waveguide 32, a CW circulating mode can be selected, and a stable operation can be carried out. Therefore, the third embodiment can also obtain the same advantage as the first embodiment. Furthermore, since the Si feedback waveguide 32 is provided outward of the ring-shaped light-emitting portion 20, its radius can be set great. Therefore, it is possible to further reduce light output from the Si feedback waveguide 32.

Furthermore, the radius of the light-emitting portion 20 can be set small regardless of the radius of the Si feedback waveguide 32. Thereby, it is possible to emit light with smaller current. In addition, a resonant wavelength interval of the microring LD is great, whereby between different resonant wavelengths, hopping of an oscillation wavelength does not easily occur. Therefore, the operation is stabilized.

Fourth Embodiment

Figure 9:
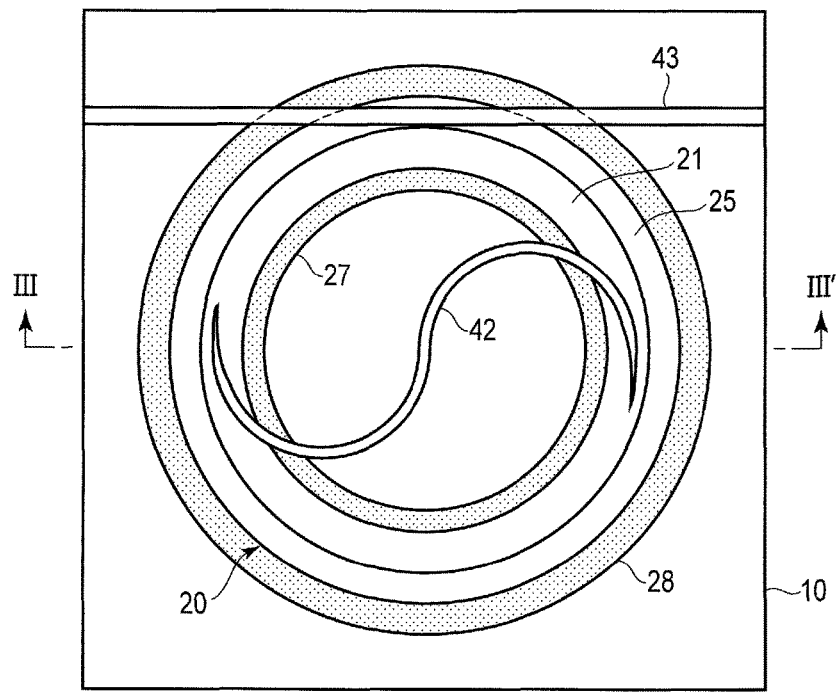
FIG. 9 is a plan view illustrating a schematic configuration of a semiconductor light-emitting element according to a fourth embodiment.
Figure 10:
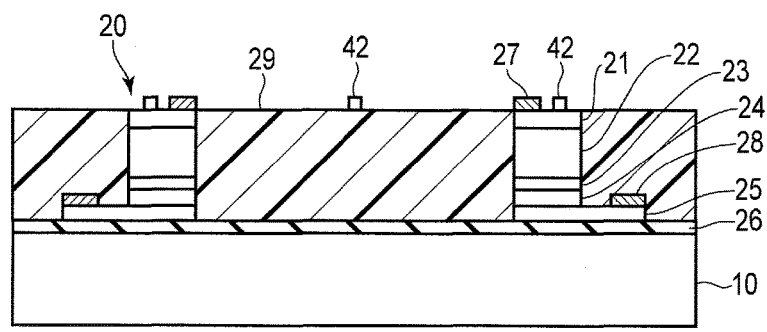
FIG. 10 is a cross-sectional view illustrating the schematic configuration of the semiconductor light-emitting element according to the fourth embodiment.

FIGS. 9 and 10 are views for explaining a schematic configuration of a semiconductor light-emitting element according to a fourth embodiment. FIG. 9 is a plan view showing a relationship between a light emitting portion and a waveguide, and FIG. 10 is a cross-sectional view which is taken along line III-III' as seen in the direction of arrows in FIG. 9. It should be noted that elements identical to those in FIGS. 1 and 2 will be respectively denoted by the same reference numbers as those in FIGS. 1 and 2, and their detailed explanations will be omitted.

In the fourth embodiment, a light waveguide is provided on a light-emitting portion, not below the light-emitting portion. In this regard, the fourth embodiment is different from the first embodiment. To be more specific, a Si feedback waveguide 42 is formed on an insulating film 29 for protection and a p-type contact layer 21 of a semiconductor multilayered structure 20 which forms the light-emitting portion. Also, on the p-type contact layer 21 and the insulating film 29 for protection, a Si output waveguide 43 formed of Si is provided such that the output waveguide 43 and a microring LS overlap with each other. The Si feedback waveguide 42 has the same S-shape as the Si feedback waveguide 12 of the first embodiment, and the Si output waveguide 43 has the linear shape as well as the Si output waveguide 13 of the first embodiment.

It should be noted that below the semiconductor multilayered structure 20, either a Si substrate 10 or a GaAs substrate is provided. If the Si substrate is provided, it suffices that after the semiconductor multilayered structure 20 is formed on the GaAs substrate, it is joined to the Si substrate 10. If the GaAs substrate is provided, it suffices that layers 21 to 25 are directly grown on the GaAs substrate without a joining method. In order to form the Si feedback waveguide 42 and the Si output waveguide 43, it suffices that after formation of the insulating film 29, for example, amorphous silicon or polycrystalline Si is formed, and processed to form waveguides.

Even in such a structure, because of provision of the S-shaped Si feedback waveguide 42, the CW circulating mode can be selected, and as a result, a stable operation can be carried out. Therefore, the fourth embodiment can also obtain the same advantage as the first embodiment.

Figure 11:
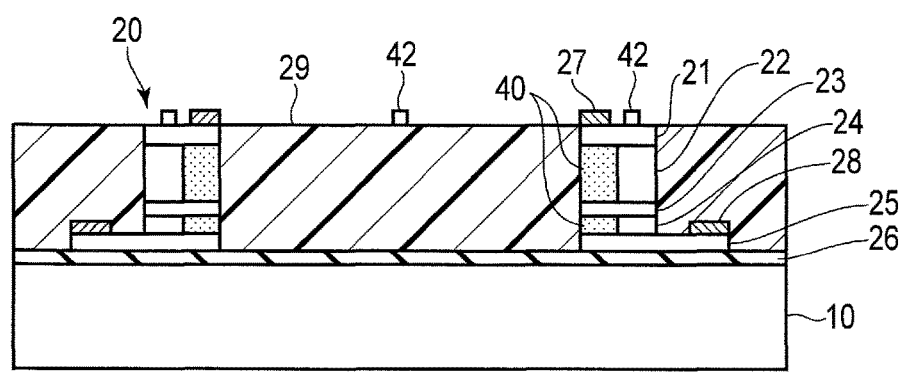
FIG. 11 is a cross-sectional view illustrating a schematic configuration of a modification of the fourth embodiment.

Furthermore, it may be set that as illustrated in FIG. 11, ion implantation is carried out on inner circumferential sides of clad layers 22 and 24 which hold an active layer 23, thereby forming a current narrowing portion 40. In this case, a current injection region of the microring LD can be further narrowed. Therefore, it is possible to emit light with smaller current. It should be noted that instead of ion implantation, it is possible to achieve narrowing with oxidation, and further achieve narrowing with mixing and crystallization.

Modifications

The present invention is not limited to each of the above embodiments.

Figure 12A:
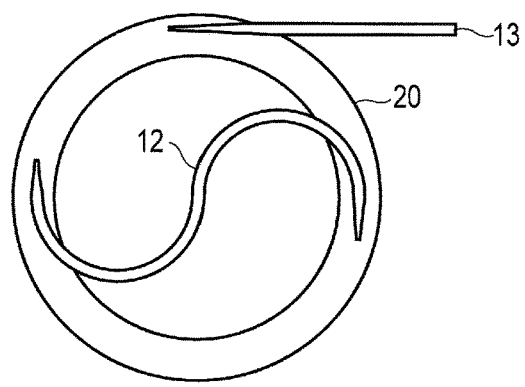
FIG. 12A is a plan view illustrating a modification of the Si feedback waveguide.
Figure 12B:
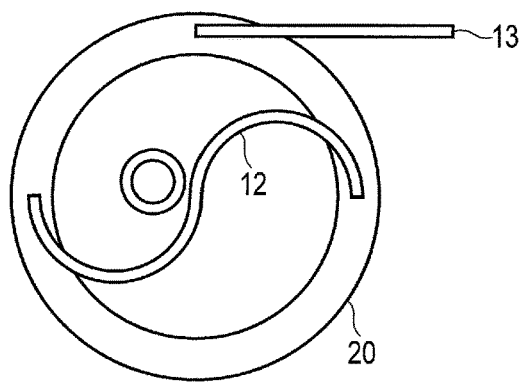
FIG. 12B is a plan view illustrating another modification of the Si feedback waveguide.
Figure 12C:
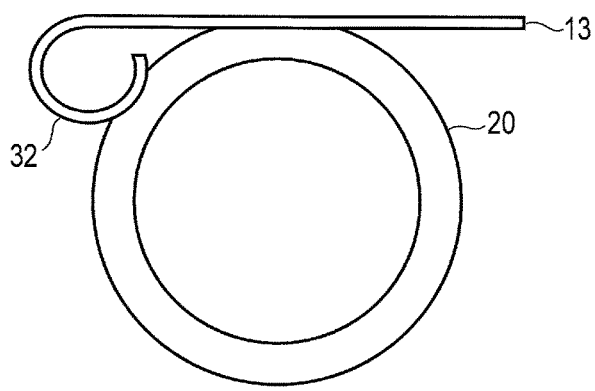
FIG. 12C is a plan view illustrating still another modification of the Si feedback waveguide.

The structures of the Si feedback waveguide and the Si output waveguide are not limited to the structures explained above with respect to the embodiments; i.e., it suffices that one of the CW and CCW circulating modes is set to achieve feedback. For examples, as these structures, such structures as illustrated in FIGS. 12A, 12B and 12C may be applied. FIG. 12A illustrates an example in which the distal end portion of the Si output waveguide 13 is tapered, and the Si output waveguide 13 and the semiconductor multilayered structure 20 overlap with each other at the distal end of the Si output waveguide 13. FIG. 12B illustrates an example in which the Si feedback waveguide 12 further comprise a Si ring resonator. FIG. 12C illustrates an example in which the Si output waveguide 13 is connected to the C-shaped feedback waveguide 32, whereby they are provided as a single body. In such a manner, the Si feedback waveguide and the Si output waveguide can be variously modified.

In the embodiments, the GaAs substrate is used as an element formation substrate of the light-emitting portion; however, it may be set that an InP substrate is used, and a double heterostructure in which an InAlGaAs active layer is held between InP clad layers is provided. Furthermore, the semiconductor material is not limited to the group III-V compound semiconductor, and rare-earth doped Si or GeSn can be applied as the semiconductor material.

Furthermore, with respect to the first embodiment, it is explained above that an n contact region of the light-emitting portion 20 is located outward of the ring, and with respect to the third embodiment, it is explained above that the n-type contact region of the light-emitting portion 20 is located inward of the ring; however, the n-type contact region can be located on the feedback waveguide. That is, in the first embodiment, a light-emitting portion 20 in which the contact region is located inward of the ring as in the third embodiment may be applied. Further, the structure of the light-emitting portion 20 is not necessarily limited to the double heterostructure; that is, it suffices that it has any structure as long as it emits light because of current injection.

Furthermore, it should be noted that structural features in which the distal end portion of the waveguide is tapered and the radius of curvature of the distal end is set greater than that of the ring of the light-emitting portion are advantageous in reduction of returning light and ensuring of a process margin, but they are not necessarily indispensable, and can be modified as appropriate in accordance with specifications. In addition, although with respect to the embodiments, the cross section of the waveguide is explained above by referring to a rectangular waveguide formed without leaving a Si slab, Si waveguides having other shapes, such as a rib type waveguide, may be applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light-emitting element comprising:
a ring-shaped light-emitting portion provided on part of a substrate;
a mode-control light waveguide formed of Si and provided on an upper surface side or a lower surface side of the light-emitting portion, and including first and second portions located close to the light-emitting portion;
an output light waveguide formed of Si and provided on the upper surface side or the lower surface side of the light-emitting portion, and including a portion located close to the light-emitting portion; and
a nitride film or an oxide film provided between the ring-shaped light-emitting portion and the mode-control light waveguide,
wherein the ring-shaped light-emitting portion and the mode-control light waveguide are indirectly in contact with each other through the nitride film or the oxide film, and
wherein the mode-control light waveguide has a structure for coupling light traveling in one of a clockwise circulating mode and a counterclockwise circulating mode of the light-emitting portion, and feeding back the light in the other of the clockwise circulating mode and the counterclockwise circulating mode.

2. The element of claim 1, wherein the mode-control light waveguide is S-shaped and located inward of the light-emitting portion, and both of the first and second portions correspond to both ends of the S-shaped light waveguide.

3. The element of claim 1, wherein the mode-control light waveguide is C-shaped and located outward of the light-emitting portion, and both of the first and second portions correspond to both ends of the C-shaped light waveguide.

4. The element of claim 1, wherein both of the first and second portions are tapered distal end portions.

5. The element of claim 1, wherein the mode-control light waveguide is either S-shaped or C-shaped and provided as a single body with the output light waveguide.

6. The element of claim 1, wherein the substrate is a Si substrate, and the light-emitting portion is a group III-V compound semiconductor.

7. The element of claim 1, wherein the light-emitting portion has a double-heterostructure in which an active layer is held between clad layers.

8. The element of claim 1, wherein the substrate is a SOI structure, and each of the light waveguides is provided by fabrication of a Si layer of the SOI substrate.

9. The element of claim 1, wherein the light-emitting portion is joined to the substrate, in which the light waveguides are provided.

10. The element of claim 7, wherein a current narrowing portion is provided inward of the clad layers.

11. A semiconductor light-emitting element comprising:
a ring-shaped light-emitting portion provided on part of a substrate;
a mode-control light waveguide formed of Si and provided on an upper surface side or a lower surface side of the light-emitting portion, and including first and second portions located close to the light-emitting portion, one or both of the first and second portions being a tapered distal end portion;
an output light waveguide formed of Si and provided on the upper surface side or the lower surface side of the light-emitting portion, and including a portion located close to the light-emitting portion; and
a nitride film or an oxide film provided between the ring-shaped light-emitting portion and the mode-control light waveguide,
wherein the ring-shaped light-emitting portion and the mode-control light waveguide are indirectly in contact with each other through the nitride film or the oxide film, and
wherein the mode-control light waveguide has a structure for coupling light traveling in one of a clockwise circulating mode and a counterclockwise circulating mode of the light-emitting portion, and feeding back the light in the other of the clockwise circulating mode and the counterclockwise circulating mode.

12. The element of claim 11, wherein the mode-control light waveguide is S-shaped and located inward of the light-emitting portion, and both of the first and second portions are tapered distal end portions corresponding to both ends of the S-shaped light waveguide.

13. The element of claim 11, wherein the mode-control light waveguide is C-shaped and located outward of the light-emitting portion, and both of the first and second portions are tapered distal end portions corresponding to both ends of the C-shaped light waveguide.

14. The element of claim 11, wherein the mode-control light waveguide is either S-shaped or C-shaped and provided as a single body with the output light waveguide.

15. The element of claim 11, wherein the light-emitting portion has a double-heterostructure in which an active layer is held by clad layers, and a current narrowing portion is provided inward of the clad layers.

* * * * *